United States Patent [19]
McDevitt, Jr.

[11] Patent Number: 5,199,889
[45] Date of Patent: Apr. 6, 1993

[54] LEADLESS GRID ARRAY SOCKET

[75] Inventor: John E. McDevitt, Jr., Cumberland, R.I.

[73] Assignee: Jem Tech, Cumberland, R.I.

[21] Appl. No.: 790,464

[22] Filed: Nov. 12, 1991

[51] Int. Cl.⁵ .......................................... H01R 23/72
[52] U.S. Cl. ...................................... 439/66; 29/843; 206/330; 439/71; 439/885
[58] Field of Search .................. 439/68, 70, 71, 72, 439/73, 66, 330, 331, 885, 910; 29/830, 739, 760, 843; 206/329, 330

[56] References Cited

U.S. PATENT DOCUMENTS

| | | | |
|---|---|---|---|
| 4,268,102 | 5/1981 | Grabbe | 439/70 |
| 4,402,562 | 9/1983 | Sado | 439/66 |
| 4,437,718 | 3/1984 | Selinko | 439/71 |
| 4,504,887 | 3/1985 | Bakermans et al. | 439/71 |
| 4,506,938 | 3/1985 | Madden | 439/71 |
| 4,508,405 | 4/1985 | Damon et al. | 439/260 |
| 4,642,872 | 2/1987 | Grabbe | 29/739 |
| 4,655,517 | 4/1987 | Bryce | 411/510 |
| 4,838,801 | 6/1989 | Bertoglio | 439/63 |
| 4,906,194 | 3/1990 | Grabbe | 439/66 |

FOREIGN PATENT DOCUMENTS 2-40880 2/1990 Japan .............................. 439/68

OTHER PUBLICATIONS

Electronic Design, Pinless Land-Grid Array Socket Houses Intel's 80386 SL Microprocessor, Mar, 1991.

Primary Examiner—Neil Abrams
Attorney, Agent, or Firm—Thomas L. Bohan

[57] ABSTRACT

An interconnection system for connecting leadless grid arrays of integrated circuits with leadless grid arrays of printed circuit boards. The system includes an insulative socket, flexible conductive elements and a compression lid. The insulative socket is temporarily affixed to the printed circuit board as the conductive elements, retained on a flexible carrier, are inserted into cavities of the socket. The cavities of the socket have inside dimensions greater than the outside dimensions of the conductive elements. After the conductive elements have been affixed to the printed circuit board, the flexible carrier is taken off of the elements and the insulative socket may be removed for visual inspection of the connection between the contact pads of the circuit board and the conductive elements. The integrated circuit is placed on top of the conductive elements such that contact pads of the circuit are properly aligned with appropriate contact pads of the printed circuit board. The compression lid is placed over the integrated circuit and affixed to the printed circuit board so as to secure the contact pads of the integrated circuit to the conductive elements.

20 Claims, 7 Drawing Sheets

LEADLESS GRID ARRAY SOCKET

BACKGROUND OF THE INVENTION

1. Field of the Invention

The present invention relates to a socket device for the interconnection of integrated circuits and printed circuit boards. More particularly, the present invention is an interconnection device comprising a plurality of isolated connectors, each of which provides electro-mechanical interconnection between contact pads of Integrated Circuits (ICs) and contact pads of Printed Circuit Boards (PCBs), and a removable insulative socket.

2. Description of the Prior Art

Rapid technological development in the field of semiconductors has led to ever-greater reductions in the size of integrated semiconductor circuits and, consequently, ever-greater circuit performance within a given physical area. At this point, further miniaturization is being limited by inter-circuit connection hardware. The fact is that the miniaturization of IC circuitry has not heretofore been extended in any significant way to the miniaturization of the interconnection between such circuitry. Whereas the circuit density has increased at a rapid rate, improvements focusing on increasing the number of available electro-mechanical interconnectors within the smaller physical framework has proceeded at a slower pace.

The number of fields where this "interconnection bottleneck" is and will be a problem is virtually immeasurable. In the field of Application-Specific Integrated Circuits (ASICs), for example, the interconnection problem is already an acute one. (An ASIC is any integrated circuit that is customized for a specific application, either in the field by an end user employing programmable logic, or by a semiconductor manufacturer using standard cell-based and full custom-based designs) Currently, there are ASIC chips used in cell-based designs requiring as many as 500,000 interface gates on a standard-size chip. The pin-grid-array interconnection system presently used to interconnect ICs and PCBs is capable of providing only up to about 100,000 gates for a chip of equivalent size. Even recent developments in interstitial pinning will not be able to keep up with the demand for increased contact-point density. This has led to an increased interest in leadless grid arrays in ASIC technology. This present interest in the ASIC field will soon extend to the telecommunications and computer systems fields as well. Those industries, in common with the ASIC industry, need to keep interconnection paths as short as possible in order to accommodate circuits operating at higher and higher speeds (i.e., to avoid having the overall speed limited by the leads). The current approach is to bring the signal interconnection between the circuits as close to a circuit's termination point as possible. Traditional through-board printed circuit terminals will not provide such an interconnection. Instead, a surface-mount-to-surface-mount, small-profile interconnection is required-one which will provide an interconnector which is as electrically transparent as possible. This need has also led to increasing interest in leadless grid arrays as replacements for installed pin grid arrays.

The pin density limitations noted above are attributable to, among other things, the fact that the pins themselves must provide adequate and reliable interconnection. Although it may be possible to reduce pin size to accommodate more pins for a given package size, IC industry pin requirements limit the extent to which pin diameters may be reduced. The minimum permissible pin diameter is presently 0.016". This limitation is driven by the need to provide conductive interconnectors that are of sufficient strength and rigidity to provide reliable electrical conductivity. Another factor limiting pin density is the accessibility of the pin terminal for attachment to a PCB. The process of staggering the pins for closer packing, or interstitial pinning, provides easier access to the pin terminals, but is only a temporary solution to the ever-increasing density problem. Still another factor limiting pin-grid-array density relates to the demands for contact between the pin terminals and the PCB contact points. Specifically, it is well known in the field that pin lengths may vary by as much as ±0.004". When large numbers of these variably-sized pins are affixed to a PCB (which itself has surface contours that magnify the problem of pin-length variations) it is extremely difficult to ensure reliable pin contact. As more and more pins become affixed, it becomes more and more difficult to join the next pin to the contact point on the PCB, particularly when the pin is a short one and the contact point is at a low spot on the PCB. Therefore, as the number of contact points on ICs and PCBs increases, the present method of interconnection of those contact points may jeopardize interconnection integrity.

As previously stated, pin grid arrays will be of limited usefulness as Input/Output (I/O) requirements—reflected in circuit gate numbers—continue to increase. In addition to the contact density limitation previously discussed, there is a limitation imposed by the process used to affix pin grid arrays to contact points on ICs and PCBs. Traditionally, there have been two basic methods for applying pin arrays, i.e., for affixing an IC to a PCB:1) soldering or brazing pin terminals onto both the IC and the PCB; 2) soldering pin terminals to the IC and inserting those pins into the PCB using socket fixtures. Several problems occur when pins are soldered or brazed to both PCB and IC contact points. Foremost of these is that once the pin grid array package is soldered to the PCB, the entire array must be removed for inspection and repair when there is a problem with one or more I/O pins located under the IC package. The time required to remove the package and repair the defect is excessive and expensive. Furthermore, the heat required to reflow the solidified solder typically causes delamination of the PCB's metalized traces from the PCB itself. If the pins are brazed on, the entire array package must be placed in an inert gas and slowly heated and then carefully cooled, also a time-consuming process requiring additional expenditures for processing materials. Complete soldering is also of concern when circuitry fails. It is generally known that most failures occur in the chips themselves. When interconnections involve soldering pins to the PCBs, the entire package must be replaced when chip failure occurs, primarily because breaking the pins from the PCBs is much too time-consuming. This last problem is partially overcome by using the other traditional method, socket fixture means. Although this eliminates half the soldering time, it does not eliminate the time needed to braze to the ICs. Furthermore, an external force must be applied to ensure adequate pin-to-PCB socket connection. Due to pin and board surface variations, and ever-increasing contact density, this force must be extremely high in order to ensure a reliable connection; it also must be sufficient to make all the interconnections gastight in order to prevent microcorrosion. Furthermore, when the circuitry is designed such that the pins protrude through the PCB, not only do the high-speed transfer limitations associated with through-terminal connectors arise, but the pins of these connectors must still be soldered to the PCB. Since present socketing arrangements utilize opaque plastic housing means to secure the pins in place, visual inspection of the quality of the contact between the pin and the PCB contact point is not possible. In most instances, manufacturers are required to perform x-ray inspections to evaluate contact quality, a process which is also expensive. For all of these reasons, IC and PCB developers must look to leadless grid arrays.

Leadless grid arrays simply comprise an array of conductive contact points—they are, in effect, the pin grid arrays without the pins. Elimination of the pins permits significant increases in contact-point density and eliminates all of the problems associated with pin attachment described above, and also, most of the expense. To complete the transition from pin to leadless arrays, an alternative method of interconnection between ICs and PCBs must replace the pin system described. Several methods have been developed for connecting leadless ICs with leadless PCBs. One is the two-spring contact assembly retained in an electrically-insulative socket disclosed in U.S. Pat. No. 4,838,801 issued to Bertoglio et al. in 1989. The two-element assembly of Bertoglio et al. may be used in connecting leadless arrays. The problem with this socket assembly, and others such as the one included in the mounting system described in U.S. Pat. No. 4,506,938 issued to Madden in 1985, is the impediment they present to the quality-control inspection of the interconnections. Specifically, when the springed contact assembly is affixed to the IC and PCB contact points, whether by soldering or other means, the opaque, electrically-insulative material is captured as well. In order to examine the contact quality, it is thus still necessary to perform expensive examinations, such as the x-ray evaluation previously noted for pin grid arrays. Another problem associated with contact assemblies captured in an electrically-insulative material is the fact that such materials have dielectric constants ranging from 2.5 to 4 and more. Since the contact assemblies are in contact with the material, there is no air gap. Air is an ideal insulative dielectric material; it has a dielectric constant of one. Thus an interconnection system comprising a combination of a solid insulative material and air would provide enhanced dielectric insulation qualities.

Systems which utilize small particles of conductive material dispersed within a polymeric insulative material, such as the system described in U.S. Pat. No. 4,402,562 issued to Sado in 1983, fail as highly effective interconnectors. The polymeric material, rather than the conductive element, is used to develop the electromechanical force necessary for reliable interconnection. Furthermore, direct contact of the insulative material and the conductive elements leads to a higher dielectric constant and, therefore, more concerns regarding spurious capacitance effects than if there was a gap between the insulative material and the conductors.

Therefore, what is needed is a low-cost interconnection system which will accommodate present and future high density leadless grid arrays of ICs and PCBs. What is also needed is an interconnection system which provides for ready access of contact elements affixable to IC and PCB contact points. Further, what is needed is an interconnection system which provides for easy means of affixing contact elements to IC and PCB contact points. Still further, what is needed is an interconnection system with reliable means for aligning contact elements with IC and PCB contact points and maintaining circuit integrity. What is also needed is an interconnection system wherein contact-element-to-contact-point integrity can be easily and inexpensively inspected.

SUMMARY OF THE INVENTION

It is an object of the present invention to provide an interconnection system for high-density leadless grid arrays wherein connection of corresponding contact pads of ICs and PCBs is achievable quickly, accurately, and reliably. It is also an object of the present invention to provide an interconnection system wherein once conductive elements are affixed to leadless contact pads, the contact integrity can be quickly and easily inspected. As part of these objectives, the interconnection system of the present invention comprises a plurality of conductive elements that are positioned in, but totally independent of, an insulative component of the system. The insulative component is a socket comprising a plurality of cavities corresponding in number to the contact pads of a parallel IC. In operation, the insulative component is first fastened temporarily to a PCB. The conductive elements, which correspond in number to the socket cavities and which are separately aligned on a temporary carrier, are then introduced to the cavities without any attachment to the insulative component. Well-known means can then be used to affix the conductive elements to the contact pads of the PCB and the temporary carrier may be removed from the conductive elements. In this way, the insulative component provides for proper alignment of the conductive elements on the contact pads of the PCB, and yet it can be easily removed for visual inspection of contact integrity. Once inspection is complete, the insulative component is repositioned on the PCB with the now-secured conductive elements affixed to the contact pads, the insulative component acting as a dielectric barrier. The insulative component also acts as a mechanical support: 1) for the conductive elements as they are affixed to the PCB; and 2) for the IC oriented on the conductive elements. Lid means may then be used to secure the contact pads of the IC to the conductive elements of the interconnection system of the present invention. Locking of the lid means into position provides a compression force on the conductive elements in that the downward force of the lid means and the upward force of the contact surface of the underlying PCB define the total interconnection force between the leadless grid array elements. The spring force of the conductive element develops independently of the insulative component.

The heart of the invention lies in the use of the removable insulative component. Although interconnection devices for leadless grid arrays exist, there are none available which overcome the problems associated with the inspection of contact integrity. Through the use of the removable insulator described herein or an equivalent one, the interconnection system of the present invention not only provides an alignment means to ensure proper IC/PCB interface connections, tha fact that it is totally independent of the conductive elements ensures easy contact inspection. The insulative component should be made of material suitable for fine-line molding, should be capable of withstanding short-term temperatures as high as 400°-500° F., and must resist ionization degradation. The fine-line molding characteristic in particular enables the manufacturer to mold the insulative component with uniformlysized cavities of dimensions suitable for isolation of typical conductive elements. Furthermore, the insulative component may comprise PCB-retention means for retaining the insulative component in place as contact elements are deployed. The insulative component may be formed so as to accept contact elements on a wide range of grid spacings, as a function of IC pitch-interface requirements. Grid spacings may range from as small as 0.02 inch to as large as 4 inches or more. The insulative component of the present invention is removable because it is not permanently affixed to either circuit package surface. Instead, it is mechanically held in place along with the other package components by some type of lid means. Because the insulative component is removable, the conductive-element-to-contact-pad attachment integrity can be visually determined, particularly when that attachment is achieved by some form of soldering. Finally, the insulative component of the present invention may be fabricated with a low surface profile, thereby enabling a manufacturer to stack a plurality of interconnection systems.

Another key feature of the present invention is the conductive elements themselves. Due to the problems associated with variations in board surface flatness and board flexibility, as well as variations in the dimensions of the elements themselves, it is necessary to use a conductive element which is flexible and which provides more element-to-board contact. Prior art pins typically used as conductive elements are not as reliable as desired because they provide rigid, single-point contact. With such a point contact any type of board deflection may readily degrade the interface connection. On the other hand, the conductive elements of the present invention are designed such that the interface between the element and the PCB is flexible and is a surface contact rather than a point contact. This is achieved by using conductive elements that are not only spring members, but that contact the IC and the PCB at top and/or bottom tangent surfaces of the elements. Specifically, the elements of the present invention may be formed-using any suitable electrically-conductive material—into an "S"-shape, a "C"-shape, or any other shape that deflects when an axial force is applied. The element must be formed so as to produce surface area contact rather than point contact when attached to the IC and PCB. This surface-to-surface contact not only leads to far fewer contact breaks, it also provides a much greater "wipe" surface for good electrical conductivity and high speed transmission capability.

The conductive elements of the interconnection system of the present invention may be placed within the cavities of the insulative component by any number of means. Nevertheless, since it is one goal of the present invention to reduce the dielectric constant between conductive elements, it is necessary to introduce an air gap between the insulative component and the conductive elements. This is achieved by making the inside dimensions of the cavities of the insulative component greater than the outside dimensions of the conductive elements. Of course, this means that if the conductive elements are placed loosely within the cavities, they will be cocked, and lean against the cavity walls. As a result, the wipe surface will be reduced and the dielectric constant greater, due to the conductive elements resting the cavity walls. For this reason upon insertion, the plurality of contact elements must be properly aligned with corresponding contact pads, and they must remain aligned during the affixation process, by some means other than the insulative component. This is achieved in the present invention by the use of a flexible carrier to which the conductive elements are attached. The conductive elements are first applied to the carrier, which may be made of metal or plastic, and configured such that they will ultimately correspond to the contact pads of the applicable IC and PCB. Once attached to the carrier they can be positioned within the cavities of the insulative component. If the conductive elements are to be soldered in place, the flexible carrier must be capable of withstanding short-term temperatures of about 400°-500° F. Once the elements have been affixed to the contact pads, the flexible carrier may be removed from the top surface of the elements. Additionally, the flexible carrier provides a convenient means by which the conductive elements can be retained in the desired array while the entire circuit package is being shipped.

The lid means previously noted provides the loading force necessary for reliable, non-soldered contact between the contact pads of the IC and the conductive element of the interconnection system. This compression attachment means permits a user to remove a failed chip without wasting the remainder of the circuit package. Stiffener bars may be incorporated into the lid so as to ensure uniform compression force, as is known in this field.

The features described herein combine to form an interconnection system suitable for use with present and future high-density leadless grid arrays. The interconnection system of the present invention: 1) provides for easy access to grid contact points; 2) provides easy and inexpensive means of affixing conductive elements to contact pads; 3) provides for reliable means of maintaining the alignment of conductive elements on contact pads as the conductive elements are being affixed; 4) provides highly reliable surface-to-surface conductive contact between elements and pads; 5) provides easy and inexpensive means for inspecting contact integrity; and 6) provides means for easily removing a failed IC from the remainder of a circuit package. These and other features of the interconnection system of the present invention can be seen upon review of the following detailed description and the accompanying drawings.

DETAILED DESCRIPTION OF THE PREFERRED EMBODIMENT

Figure 1:
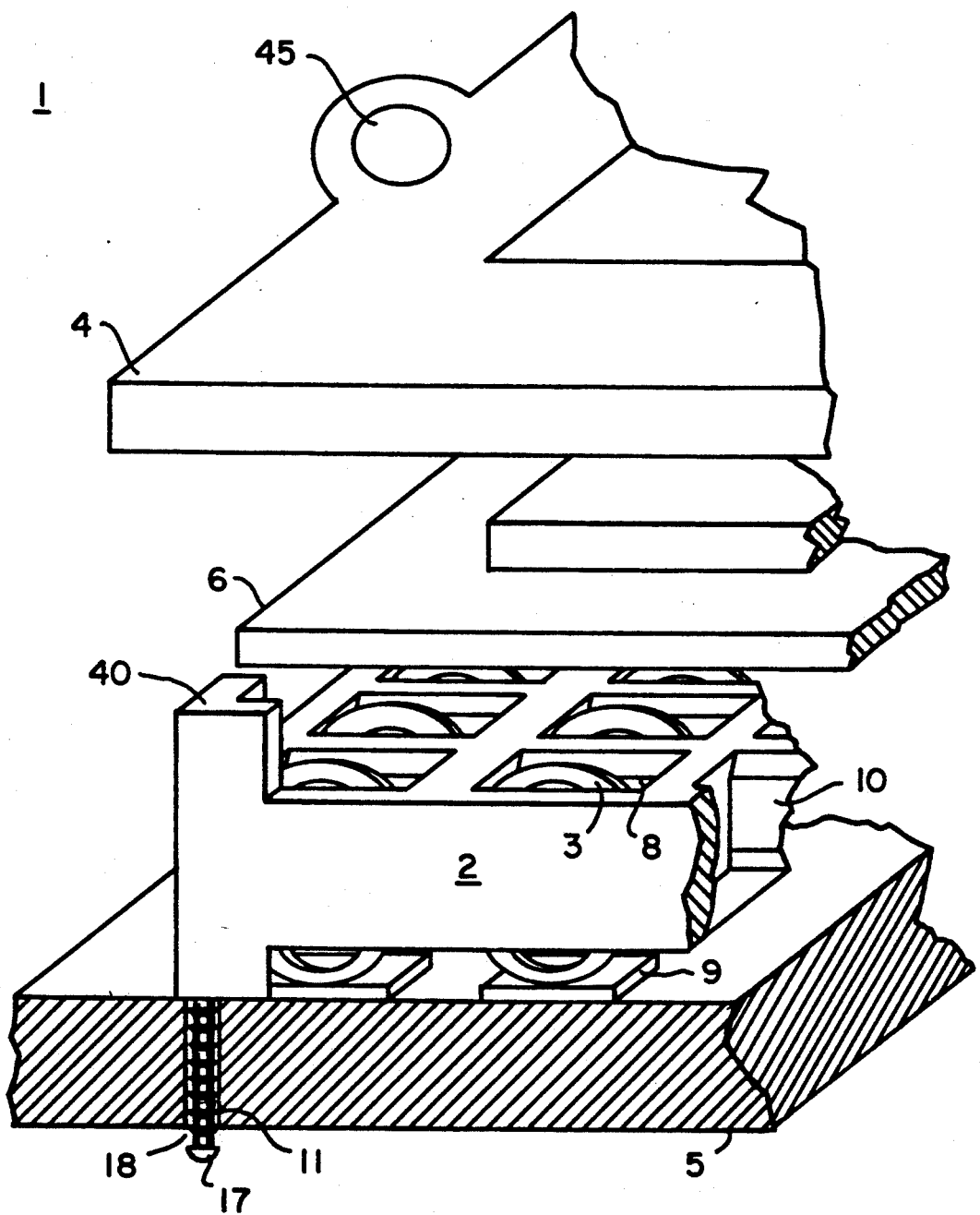
FIG. 1 is a perspective view of a section of a complete circuit package, including the interconnection system of the present invention.
Figure 1A:
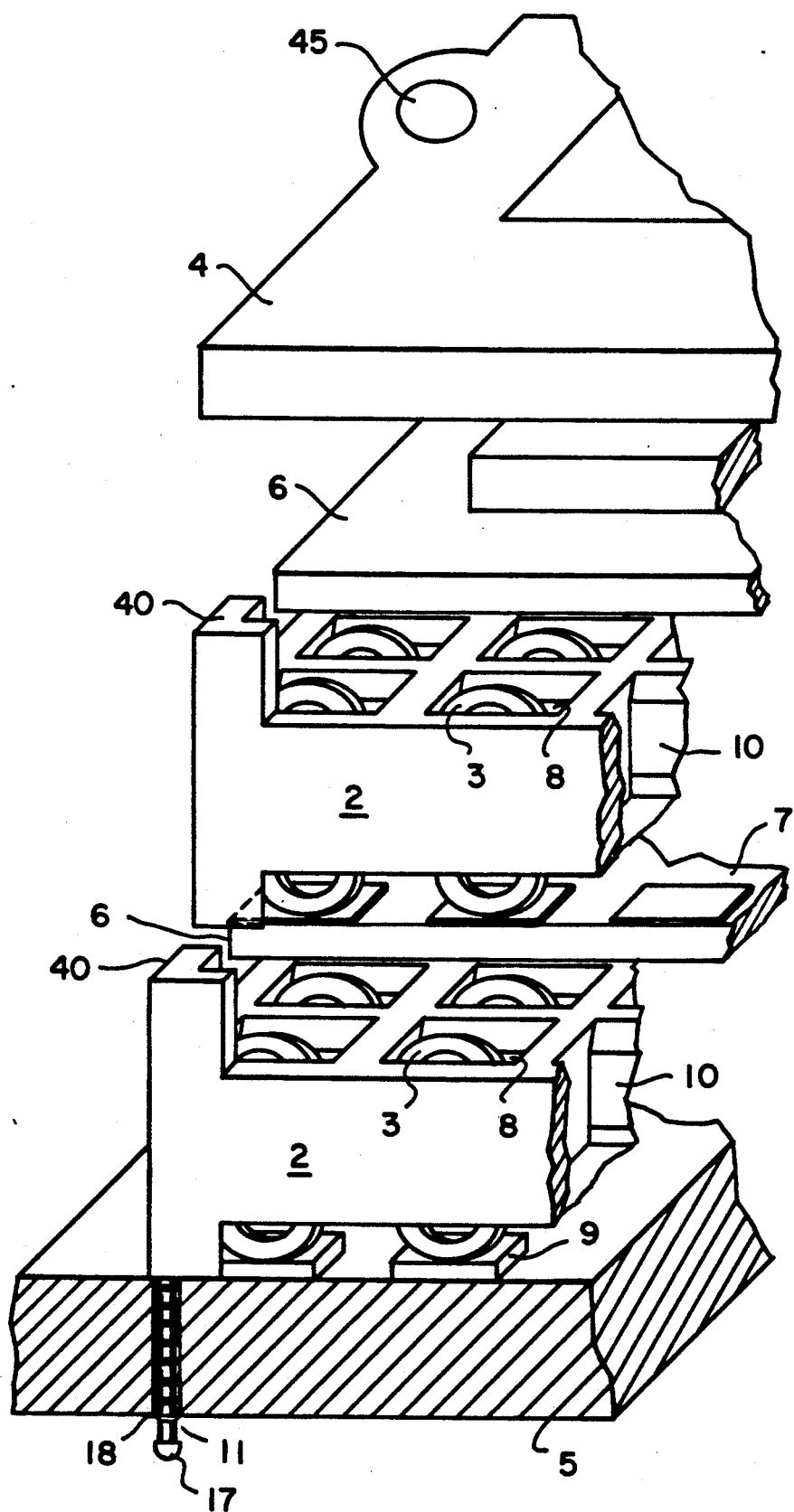
FIG. 1A is a perspective view of a section of a plurality of integrated circuits and accompanying interconnection systems of the present invention stacked together.
Figure 2:
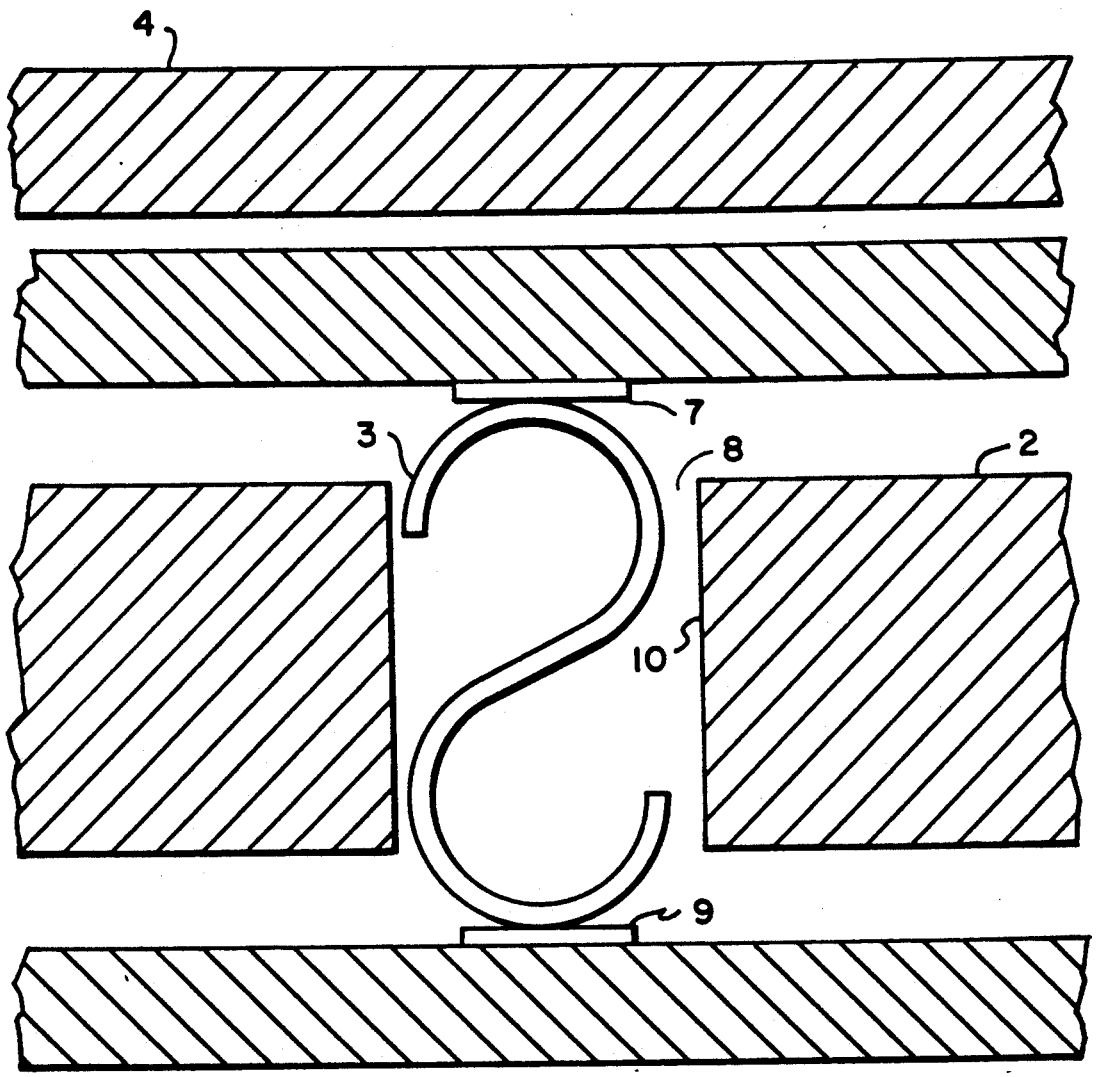
FIG. 2 is a cross-sectional view of the interconnection system of the present invention.
Figure 3:
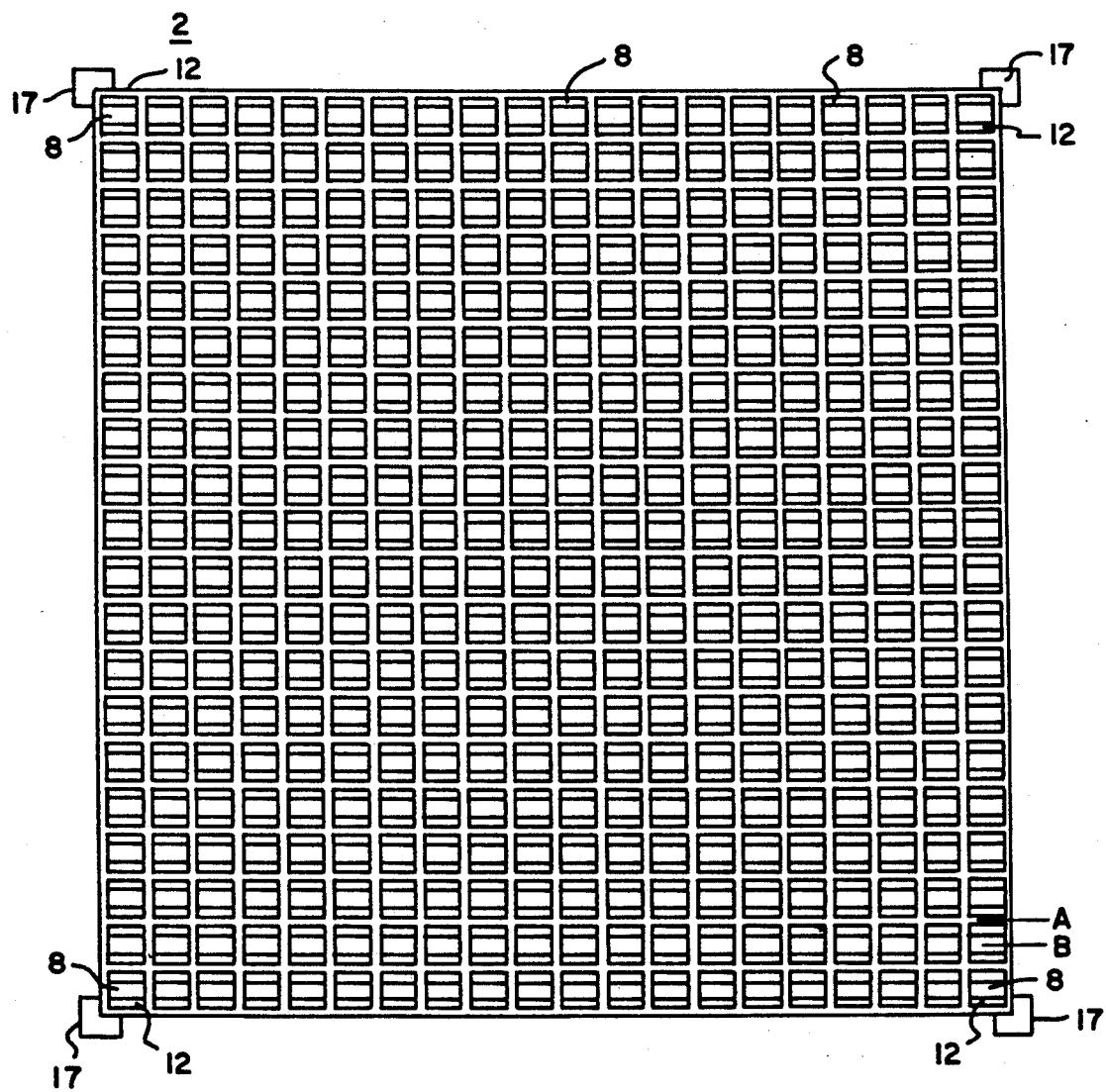
FIG. 3 is a top view of a typical grid of the insulative component of the present invention.
Figure 4:
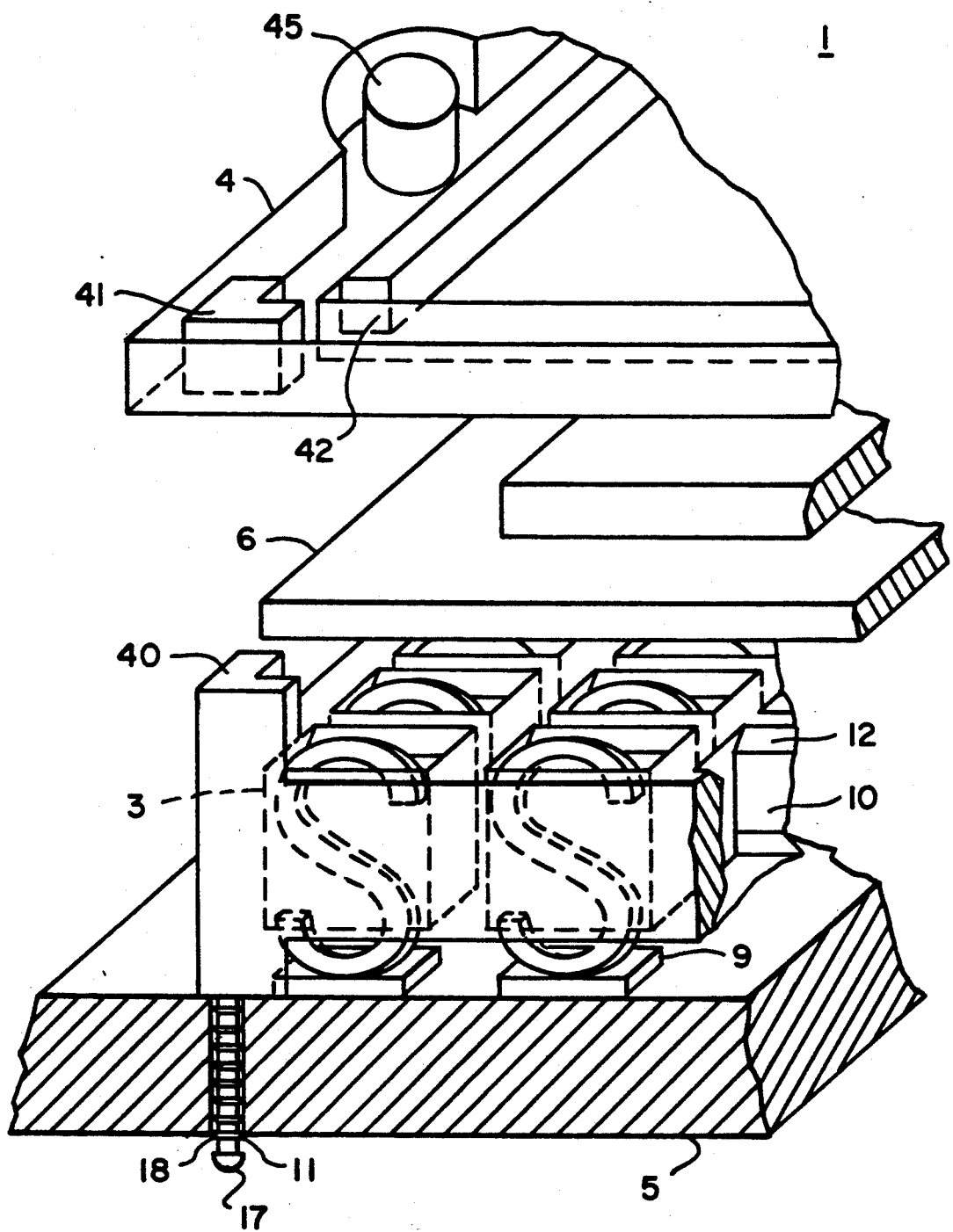
FIG. 4 is a cut-away view of the perspective view presented in FIG. 1, showing exemplar conductive elements of the present invention.

As illustrated in FIGS. 1-4, an interconnection system 1 of the present invention preferably comprises a socket insulator 2, a conductive element 3 and a compression lid 4. The combination of components comprising said interconnection system 1 is used in conjunction with a PCB 5 and an IC 6, wherein said IC 6 comprises a plurality of IC contact pads 7 forming a leadless grid contact array. Said socket insulator 2 comprises a plurality of socket cavities 8, as illustrated in FIG. 2. Said socket insulator 2 is preferably molded of a liquid crystal polymer, or similar high-temperature thermoset resin compound, of the type generally used in the field as a fine-line molding material. Said socket cavities 8 are formed such that they are aligned with PCB contact pads 9. Said socket insulator 2 is temporarily retained on said PCB 5 by a plurality of insulator retention legs 17. Said retention legs 17 may be formed of the same material used in making said socket insulator 2. Furthermore, in the preferred embodiment, said retention legs 17 and said socket insulator 2 are fabricated as one piece. Retention ribs 11 of said retention legs 17 provide the locking means by which said socket insulator 2 is temporarily retained on said PCB 5. In use, said retention legs 17 are inserted into retention cavities 18 located along the perimeter of said PCB 5 and locked into place with said retention ribs 11. Said retention legs 17 may vary in length in accordance with the size of said PCB 5 and whether a plurality of circuit boards are to be stacked together, as illustrated in FIG. 1A.

Figure 5:
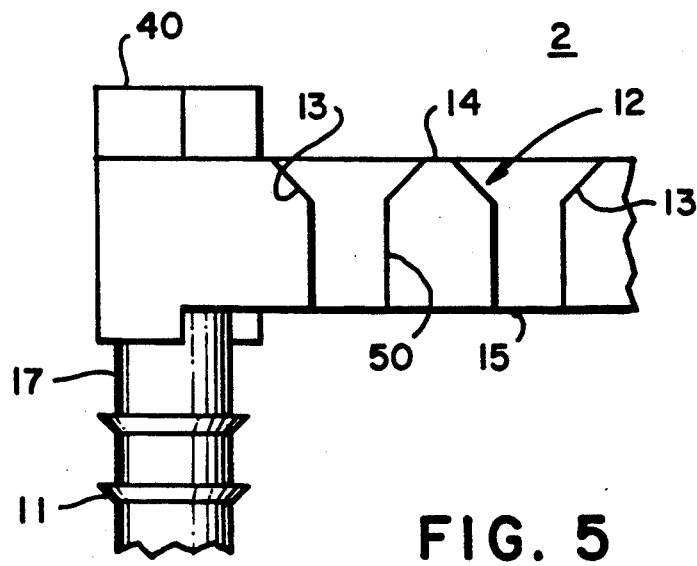
FIG. 5 is an end view of one section of the insulative component of the present invention, including a cross-sectional view of two socket cavities.

As illustrated in FIG. 5 (not drawn to scale), said socket cavities 8 are about 0.200" in depth, spaced 0.050" on center and are about 0.020" on a side at a bottom insulator socket surface 15, up to a chamfer 12, which extends to a depth of about 0.010". Said chamber 12 preferably comprises a lead-in 13, wherein said lead-in 13 is set at an angle of no more than 45° and wherein said chamfer 12 is about 0.040" on a side at a top insulator socket surface 14. The design of said socket cavities 8 permits easy placement of said conductive elements 3 on said PCB contact pads 9. In addition, said socket cavities 8 are formed such that their inside dimensions exceed the outside dimensions of said conductive elements 3 to the extent that there exists an air gap between said conductive elements 3 and inside cavity walls 10 of about 0.003". This minimizes the dielectric constant of said socket insulator 2 so as to minimize spurious capacitance effects.

Figures 6A, 6B, 6C, 6D:
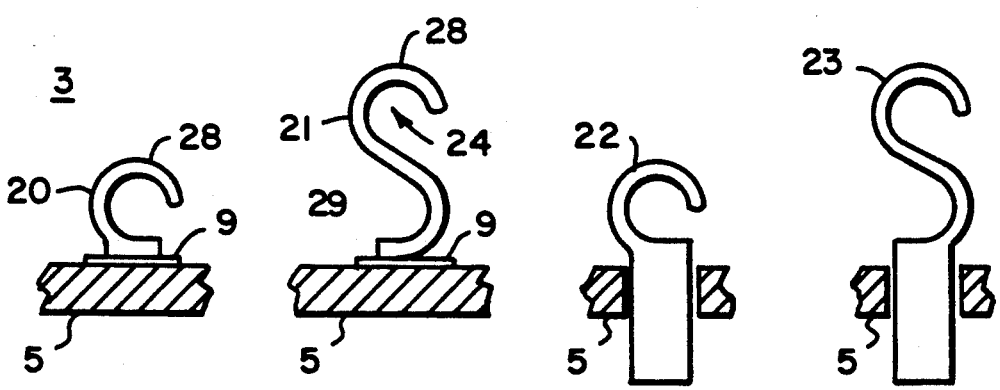
FIG. 6A is a side view of a low-profile C-shaped conductive element.
FIG. 6B is a side view of a standard S-shaped conductive element of the present invention.
FIG. 6C is a side view of a low-profile C-shaped through-hole conductive element of the present invention.
FIG. 6D is a side view of a standard S-shaped through-hole conductive element of the present invention.

Once said socket insulator 2 has been temporarily affixed to said PCB 5 with said retention legs 17, said conductive elements 3 may be inserted into said socket cavities 8. As previously indicated, said conductive elements 3 are preferably springlike elements. For illustrative purposes only, FIG. 6 shows several possible configurations of said conductive elements 3. In particular, a low-profile C-shaped element 20, a standard S-shaped element 21, a low-profile C-shaped through-hole element 22, and a standard S-shaped through-hole element 23 are presented. Said C-shaped element 20 and said S-shaped element 21 may be soldered or mechanically affixed to said PCB contact pad 9. In the preferred embodiment of the invention, said conductive elements 3 are formed of Beryllium-Copper (BeCu), or some other suitable conductive material. When said conductive elements 3 comprise a plurality of said S-shaped element 21, said S-shaped elements 21 have an average wall thickness of about 0.010", an average inside radius 24 of about 0.012", are about 0.060" in height in their relaxed state and about 0.050" in height in their compressed state. When said conductive elements 3 comprise a plurality of said C-shaped elements 20, said C-shaped elements 20 have an average wall thickness of about 0.010", an average inside radius 24 of about 0.012", are about 0.035" in height in a relaxed state and about 0.025" in height in a compressed state.

Figure 7:
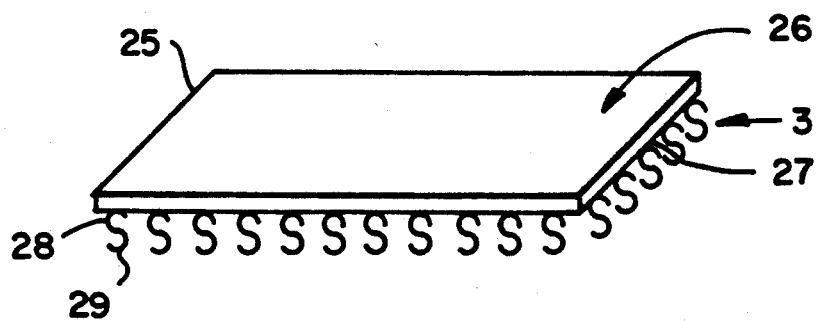
FIG. 7 is a perspective view of the flexible carrier system of the present invention.

In order to accurately place said conductive elements 3 within said socket cavities 8, said conductive elements 3 are first aligned on a flexible carrier 25 in a pattern corresponding to the pattern of said PCB contact pads 9. In the preferred embodiment of the invention said flexible carrier 25 comprises a flexible backing 26 and an adhesive layer 27, wherein a top conductor surface 28 of said conductive elements 3 are placed in contact with said adhesive layer 27 such that they are retained, in proper position, on said flexible carrier 25, as illustrated in FIG. 7. Although said flexible backing 26 may be fabricated of a metal or plastic material, in the preferred embodiment of the invention, said flexible backing 26 is a high-temperature plastic such as MYLAR by DuPont, or a polyimide plastic. Said flexible backing 26 is about 0.010" thick.

Once said conductive elements 3 are positioned within said socket cavities 8 of said socket insulator 2, said conductive elements may then be affixed to said PCB contact pads 9. In order to achieve the objectives previously noted, it is desirable to affix said conductive elements 3 to said PCB contact pads 9 by quick and easy means. In this regard, two methods of affixation, both generally known, are described. First, reflow soldering means may be used to affix said conductive elements 3 to said PCB contact pads 9. Specifically, a solder paste 30, of any commonly used type, is applied to said PCB contact pads 9 prior to insertion of said conductive elements 3 into said socket cavities 8. After positioning said insulator socket 2 on said PCB 5 using said retention legs 17 for guidance and affixation, bottom conductor surfaces 29 of said conductive elements 3 are placed on said solder paste 30, as said flexible carrier 25 remains in contact with said top conductor surfaces 28. The combination of said PCB 5, said insulator socket 2 and said conductive elements 3 on said flexible carrier 25 are then placed in an oven for vapor-phase reflow soldering. The vapor-reflow soldering process takes less time than standard brazing techniques. Once the process is completed, generally in about 5-10 minutes, said flexible carrier 25 may be removed and discarded, as said conductive elements 3 remain affixed to said PCB contact pads 9. Another method of affixation involves simply permitting said conductive elements 3 to float within said socket cavities 8. The contact of said bottom conductor surface 29 of said conductive elements 3 to said PCB contact pads 9 is developed simply by the force exerted by said compression lid 4. If necessary, protrusions may be molded into said socket cavities 8 to temporarily retain said conductive elements 3. In both methods of affixation said insulator socket 2 remains completely independent of said conductive elements 3 and in no way is said insulator socket 2 used to develop the contact force at said top conductor surfaces 28 and said bottom conductor surfaces 29 of said conductive elements 3. Instead, said compression lid 4, or some other force application means is used to supply the force necessary to provide reliable contact between said PCB contact pads 9 and said conductive elements 3. If desired, said insulator socket 2 may be removed once said conductive elements 3 have been affixed to said PCB contact pads 9 so that the interface between said PCB contact pads 9 and said bottom surfaces 29 may be visually inspected.

Figure 8:
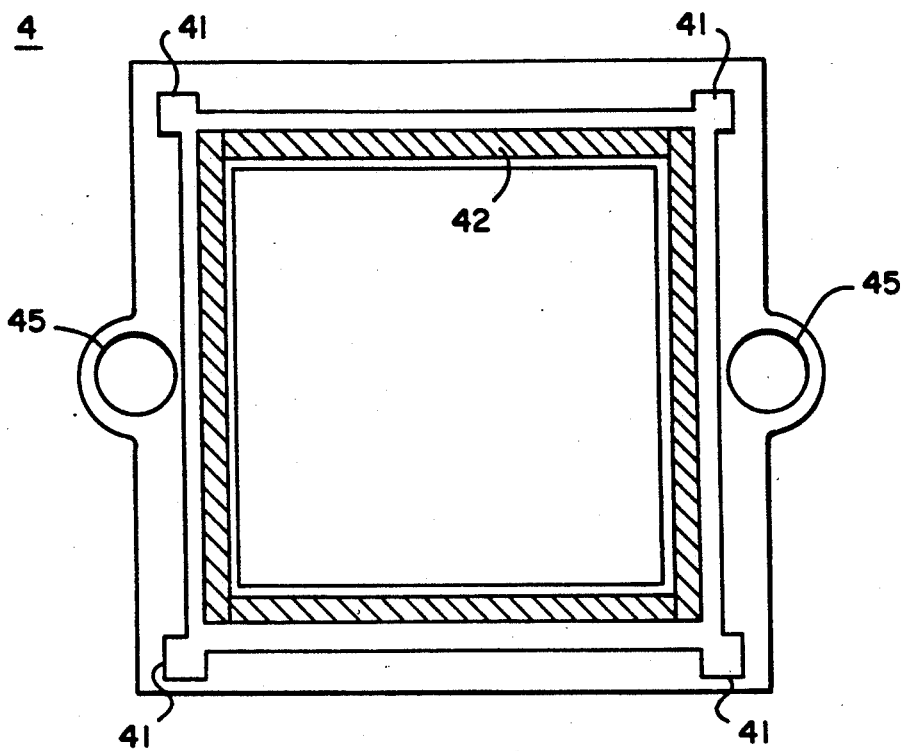
FIG. 8 is a bottom view of the compression lid of the present invention.
Figure 9:
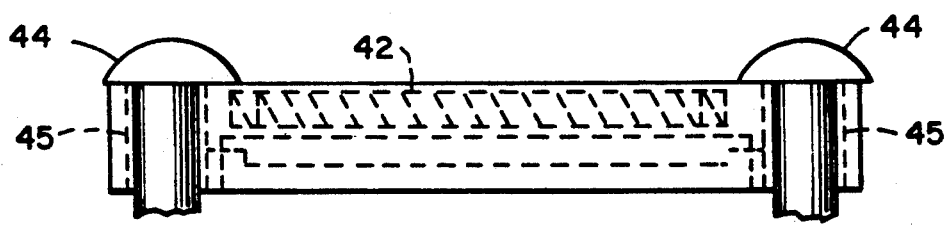
FIG. 9 is a side view of the compression lid of the present invention.
Figure 10:
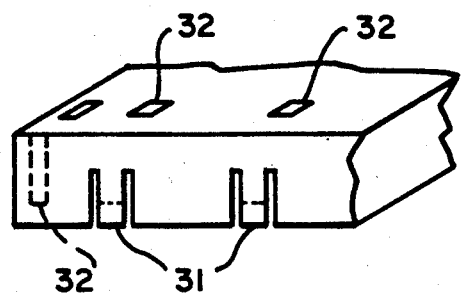
FIG. 10 is a perspective view of a portion of the compression lid of the present invention.
Figure 11:
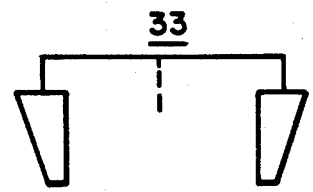
FIG. 11 is a side view of the lid extractor tool of the present invention.

After inspection, said insulative socket 2 may be repositioned on said PCB 5, and said IC 6 may be placed in position such that said IC contact pads 7 are properly aligned with corresponding top conductor surfaces 28 of said conductive elements 3. Once said IC 6 is in position, said compression lid 4 is placed onto said IC 6. Raised corners 40 of said insulator socket 2 orient said compression lid 4 to said PCB 5. As illustrated in FIGS. 8 and 9, said compression lid 4 is oriented to the remainder of the circuit package when said raised corners 40 are fitted into recessed corners 41 of said compression lid 4. Alternatively, said raised corners 40 may act as secondary seating planes for a cavity-down version of the present invention. Furthermore, when said IC 6 is a ceramic chip, said raised corners 40 act as primary seating planes. Retention screws 44 are inserted into retention screw holes 45 of said compression lid 4 in order to provide the force necessary to ensure sufficient contact pressure between said conductive elements 3 and said IC contact pads 7, said PCB contact pads 9, or both. Said compression lid 4, may be made of any suitable material, such as aluminum, a molding resin, or the like, and it may vary in shape and size as a function of the number and size of said ICs 6 and said PCBs 5 placed in parallel. A lid stiffener 42 may be incorporated into the design of said compression lid 4 to provide stiffening to said interconnection system 1 as required. In the preferred embodiment, as illustrated in FIGS. 10 and 11, said compression lid 4 comprises spring clips 31 and extractor slots 32 for ease of compression lid removal, wherein a lid extractor tool 33 may be placed into said extractor slots 32 in order to push out said spring clips 31.

Although the preferred embodiment of the present invention is described and illustrated herein, various modifications and substitutions may be made without departing from the spirit and scope of the invention. Accordingly, it is to be understood that the present interconnection system has been described by way of illustration and not limitation.

I claim:

1. A leadless grid array interconnection device for connecting an integrated circuit and a printed circuit board, wherein said integrated circuit comprises an integrated circuit leadless grid array, wherein said integrated circuit leadless grid array comprises a plurality of integrated circuit contact pads and said printed circuit board comprises a plurality of printed circuit board contact pads, and wherein the pattern of said printed circuit board contact pads corresponds to the pattern of said integrated circuit leadless grid array, said leadless grid array interconnection device comprising:
   a. conductive element array comprising a plurality of conductive elements connectable to said integrated circuit contact pads and said printed circuit board contact pads; and
   b. a removable insulative component comprising a plurality of socket cavities, each of said socket cavities formed for fully surrounding one of said conductive elements, wherein said insulative component is designed to be removably affixed to said printed circuit board, and wherein the pattern of said socket cavities corresponds to the pattern of said plurality of printed circuit board contact pads, said insulative component being removable from said printed circuit board while leaving said conductive element array connected to said printed circuit board contact pads to enable inspection of said conductive elements.

2. The device as claimed in claim 1 wherein said insulative component also comprises a plurality of retention legs, wherein said retention legs are designed to be removably retained within retention cavities of said printed circuit board.

3. The device as claimed in claim 1 further comprising a compression lid, wherein said compression lid is designed to be placed on said integrated circuit and then detachably affixed to said printed circuit board such that said compression lid forces said plurality of integrated circuit contact pads onto said plurality of conductive elements so as to provide electrical contact between said integrated circuit contact pads and said conductive elements.

4. The device as claimed in claim 3 wherein a lid stiffener is affixed to said compression lid, wherein said lid stiffener is designed to provide equal distribution of compression force on said conductive elements.

5. The device as claimed in claim 1 wherein said conductive elements are S-shaped spring members.

6. The device as claimed in claim 1 wherein said conductive elements are C-shaped spring members.

7. The device as claimed in claim 1 wherein said insulative component is made of a liquid-crystal polymer.

8. The device as claimed in claim 1 wherein said socket cavities comprise chamfered lead-in walls.

9. The leadless grid array interconnection device as claimed in claim 1 further comprising means for distributing said conductive elements among said socket cavities so as to avoid contacting said conductive elements with interior walls of said socket cavities.

10. The device as claimed in claim 9 wherein said means for distributing said conductive elements into said socket cavities is a flexible carrier, wherein said flexible carrier is detachably affixable to said plurality of conductive elements, and wherein said flexible carrier comprises means for temporarily retaining said conductive elements on said flexible carrier such that said conductive elements are spatially distributed with respect to one another in a manner corresponding to the design of said integrated circuit leadless grid array.

11. The device as claimed in claim 10 wherein said flexible carrier is a high-temperature plastic and said means for retaining said elements is an adhesive.

12. The device as claimed in claim 10 wherein said flexible carrier is a metal film and said conductive elements are mechanically affixed to said metal film.

13. A leadless grid array interconnection device for connecting a plurality of integrated circuits with a printed circuit board, wherein each of said plurality of integrated circuits comprises an integrated circuit leadless grid array, and wherein each of said integrated circuit leadless grid arrays comprises a plurality of integrated circuit contact pads and said printed circuit board comprises a plurality of printed circuit board contact pads, said leadless grid array interconnection device comprising:
  a. a plurality of conductive element arrays corresponding in number to the number of said integrated circuits, wherein each of said plurality of conductive element arrays comprises a plurality of conductive elements connectable to said integrated circuit contact pads and said printed circuit board contact pads; and
  b. a plurality of removable insulative components corresponding in number to the number of said conductive element arrays, wherein each of said insulative components comprises a plurality of socket cavities, each of said socket cavities formed for fully surrounding one of said conductive elements, wherein at least one of said plurality of removable insulative components comprises a plurality of retention legs, wherein said plurality of retention legs removably affixes said plurality of removable insulative components to said printed circuit board in a manner such that a variable number of said integrated circuits, and said printed circuit board, may be stacked one on top of another and electrically connected, and wherein the pattern of said socket cavities corresponds to the pattern of said integrated circuit contact pads and said printed circuit board contact pads, each of said insulative components being removable from said printed circuit board while leaving said plurality of conductive element arrays connected to said printed circuit board contact pads or to said integrated circuit contact pads to enable inspection of said conductive elements.

14. The leadless grid array interconnection device as claimed in claim 13 furthering comprising means for distributing said plurality of conductive elements among said socket cavities so as to avoid contacting said conductive elements with interior walls of said socket cavities.

15. A leadless grid array interconnection device for connecting an integrated circuit and a printed circuit board, wherein said integrated circuit comprises an integrated circuit leadless grid array, wherein said integrated circuit leadless grid array comprises a plurality of integrated circuit contact pads and said printed circuit board comprises a plurality of printed circuit board contact pads, and wherein the pattern of said printed circuit board contact pads corresponds to the pattern of said integrated circuit leadless grid array, said leadless grid array interconnection device comprising:
  a. a plurality of S-shaped conductive elements, each comprising a top conductor surface and a bottom conductor surface, wherein any one of said conductive elements is:
     i. connectable by said top conductor surface to any one of said plurality of integrated circuit contact pads; and
     ii. connectable by said bottom conductor surface to any one of said plurality of printed circuit board contact pads;
  b. a removable insulative component formed of a liquid-crystal polymer, said insulative component comprising a plurality of socket cavities, wherein said insulative component comprises a plurality of retention legs which removably affix said insulative component to said printed circuit board, and wherein the pattern of said socket cavities corresponds to the pattern of said printed circuit board contact pads;
  c. a flexible carrier for distributing said conductive elements among said socket cavities such that said conductive elements do not contact interior walls of said socket cavities, wherein said flexible carrier is detachably affixed to said top conductor surfaces of said plurality of conductive elements, wherein said flexible carrier is made of a high-temperature plastic, wherein said flexible carrier comprises an adhesive for retaining said conductive elements on said flexible carrier such that said conductive elements are spatially distributed with respect to one another in a manner corresponding to the pattern of said printed circuit board contact pads; and
  d. a compression lid placeable on said integrated circuit and detachably affixable to said printed circuit board, wherein said compression lid is designed to force said integrated circuit contact pads onto said plurality of conductive elements so as to provide electrical contact between said integrated circuit contact pads and said conductive elements.

16. An improved method of connecting an integrated circuit to a printed circuit board, wherein said integrated circuit comprises an integrated circuit leadless grid array, wherein said integrated circuit leadless grid array comprises a plurality of integrated circuit contact pads and said printed circuit board comprises a plurality of printed circuit board contact pads, and wherein the pattern of said printed circuit board contact pads corresponds to the pattern of said integrated circuit leadless grid array, comprising the steps of:
  a. affixing a removable insulative component to said printed circuit board, wherein said removable insulative component comprises a plurality of socket cavities, and wherein the pattern of said socket cavities corresponds to the pattern of said printed circuit board contact pads;
  b. distributing a plurality of conductive elements among said socket cavities of said affixed removable insulative component such that said conductive elements do not contact interior walls of said socket cavities, wherein each of said socket cavities is formed for fully surrounding one of said conductive element;
  c. affixing said conductive elements to said printed circuit board contact pads; and
  d. connecting said conductive elements to said integrated circuit contact pads, said insulative component being removable from said printed circuit board while leaving said conductive elements connected to said printed circuit board contact pads to enable inspection of said conductive elements.

17. The method as claimed in claim 16 further comprising the step of securing said integrated circuit to said top conductor surfaces with a compression lid, wherein said compression lid is detachably affixable to said printed circuit board.

18. The method as claimed in claim 16 wherein the step of affixing said conductive elements to said printed circuit board contact pads is achieved by reflow soldering said conductive elements to said printed circuit board contact pads.

19. The method as claimed in claim 16 further comprising the step of retaining said conductive elements on a flexible carrier, wherein said flexible carrier is used to distribute said conductive elements among said socket cavities, wherein said flexible carrier is made of a high-temperature plastic.

20. The method as claimed in claim 16 further comprising the intermediate step of temporarily removing said insulative component and inspecting the contact between said conductive elements and said printed circuit board contact pads.

* * * * *